United States Patent
Liu et al.

(10) Patent No.: US 7,443,013 B2
(45) Date of Patent: Oct. 28, 2008

(54) FLEXIBLE SUBSTRATE FOR PACKAGE OF DIE

(75) Inventors: Kuang-Hua Liu, Kaohsiung (TW); Min-O Huang, Jiangjyun Township, Tainan County (TW)

(73) Assignees: Chipmos Technologies Inc., Hsinchu (TW); Chipmos Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 11/317,978

(22) Filed: Dec. 22, 2005

(65) Prior Publication Data

US 2007/0080432 A1    Apr. 12, 2007

(30) Foreign Application Priority Data

Aug. 19, 2005    (TW) .............................. 94128293 A

(51) Int. Cl.
*H01L 23/495* (2006.01)

(52) U.S. Cl. .................. 257/673; 257/666; 257/677; 257/672; 257/782; 257/668; 257/E23.031; 257/E23.059; 257/E23.043; 257/E23.004; 257/E23.05

(58) Field of Classification Search ................ 257/737, 257/666, 673, 668, 672, 676, 782, E23.031, 257/E23.059, E23.004, E23.043, E23.05

See application file for complete search history.

(56) References Cited

U.S. PATENT DOCUMENTS

| 5,016,082 | A  | * | 5/1991  | Roth ........................... 257/735 |
| 6,107,675 | A  | * | 8/2000  | Sugimoto et al. ........... 257/666 |
| 6,124,547 | A  | * | 9/2000  | Fujimori ..................... 174/523 |
| 6,342,727 | B1 | * | 1/2002  | Fujimori ..................... 257/668 |
| 6,451,626 | B1 | * | 9/2002  | Lin ............................. 438/108 |
| 6,566,763 | B2 | * | 5/2003  | Shiozawa ................... 257/782 |
| 7,061,078 | B2 | * | 6/2006  | Cheng ........................ 257/666 |
| 2001/0054751 | A1 | * | 12/2001 | Toyosawa .................. 257/668 |

* cited by examiner

*Primary Examiner*—Marcos D. Pizarro
*Assistant Examiner*—Marc Armand
(74) *Attorney, Agent, or Firm*—Banger Shia

(57) ABSTRACT

The present invention provides a flexible substrate for a package of a die which has an active surface and a plurality of first bond pads arranged in a form of a row and formed on the active surface. The flexible substrate includes a flexible insulating film and a plurality of first leads formed on the flexible insulating film. Each of the first leads corresponds to one of the first bond pads and has a respective first body portion, a respective first bond portion and a respective first extension portion. For each of the first leads, the width of the first bond portion is larger than those of the first body portion and the first extension portion.

8 Claims, 2 Drawing Sheets

FLEXIBLE SUBSTRATE FOR PACKAGE OF DIE

BACKGROUND OF THE PRESENT INVENTION

1. Field of the Present Invention

The present invention relates to a flexible substrate for the package of a die, and more particularly, to a flexible substrate which can prevent the leads from being peeled off from the bump of the die during the packaging process. Additionally, the flexible substrate can be provided for alignment and positioning of the inner lead bonding processing machine.

2. Description of the Prior Art

In the field of integrated circuit chip packaging, flexible substrate like tape carrier package (TCP) is one of the familiar methods. TCP employs a flexible substrate with a device hole and a plurality of leads as the chip substrate. The structure of the tape carrier package is the most suitable for packaging a semiconductor device with multi-connection terminals into a compact size. Thus, such tape carrier packages are the most widely utilized carrier packages for a semiconductor device for driving a liquid crystal display panel.

The flexible substrate has a plurality of leads. The leads are used to be a connection bonded to bumps of a die, and each of them further formed an electrical connection between the flexible substrate and the die. The bumps on the die are generally gold bumps. Through an inner lead bonding process, the gold bumps are bonded to the leads on the flexible substrate.

The leads of the prior art exhibit a long slim shape, and the width of each lead is less than that of a bump. When the number of leads is increased, the width of the leads should be reduced to prevent the mutual interaction of the leads and to consider other aspects of the inner lead bonding process. Accordingly, in a multiple leads packaging process, because the leads are too thin, the adhesive force between the leads and the bumps of the die will be too weak and will further cause the leads to be peeled off from the bumps. Especially, the leads at the corner often get peeled off from the bumps because of the shear force of the thermal-expanded flexible substrate, further resulting in electrical disconnection.

Accordingly, the present invention provides a flexible substrate for the packaging of a die. The flexible substrate, in accordance with the present invention, can solve the problem of the leads being peeled off from the bumps described above. Furthermore, the flexible substrate can be provided for the alignment and positioning of the inner lead bonding processing machine.

SUMMARY OF THE PRESENT INVENTION

For achieving the objective and for solving the defects discussed above, the present invention provides a flexible substrate for a package of a die.

According to the first preferred embodiment of the present invention, a flexible substrate for the package of a die has an active surface and a plurality of first bond pads. The plurality of first bond pads are arranged in the form of a row and are formed on the active surface of the die. The flexible substrate comprises a flexible insulating film and a plurality of first leads. Furthermore, the plurality of first leads are formed on the flexible insulating film, and they provide electronic connection for the die. Each of the first leads corresponds to one of the first bond pads and has a respective first body portion, a respective first bond portion, and a respective first extension portion. In addition, the width of the first bond portion of each of the first leads is larger than that of the first body portion and the first extension portion. Furthermore, when the die is packed, the first bond portion of each of the first leads is bonded to the corresponding first bond pad by a respective first bump.

According to the second preferred embodiment of the present invention, a flexible substrate for the package of a die has an active surface, a plurality of first bond pads, and at least one second bond pad. The plurality of first bond pads are arranged in the form of a row and are formed on the active surface of the die. The flexible substrate comprises a flexible insulating film, a plurality of first leads, and at least one bridge lead. The plurality of first leads are formed on the flexible insulating film, and they provide electronic connection for the die. Each of the first leads corresponds to one of the first bond pads. The at least one bridge lead is formed on the flexible insulating film. Each of the at least one bridge lead corresponds to one of the at least one second bond pad and has two respective body portions and at least one bridge portion connected between the two body portions.

Additionally, when the die is packed, each of the first leads is bonded to the corresponding first bond pad by a respective first bump. Furthermore, each of the bridge lead is bonded to the corresponding second bond pad by a respective second bump; the size of the second bump is larger than that of the first bump.

The flexible substrate for the package of a die of the present invention has improved the shape of the leads which can increase the contact area of the leads and the bumps to ensure the bonding of the leads and the bumps. In addition, the bridge lead located on the edge of the flexible insulating film can prevent the effect of shear force and the resulting peeling off of the leads from the bump itself. Accordingly, the breaking of the leads and the resulting electricity disconnection can be avoided because of the shape of the bridge lead, thus increasing the reliability of the tape carrier package. Moreover, the flexible substrate can be further provided for the alignment and positioning of the inner lead bonding process machine.

The advantage and spirit of the present invention may be understood by the following recitations together with the appended drawings.

BRIEF DESCRIPTION OF THE APPENDED DRAWINGS

DETAILED DESCRIPTION OF THE PRESENT INVENTION

The present invention provides a flexible substrate for a packaging of a die.

Figure 1:
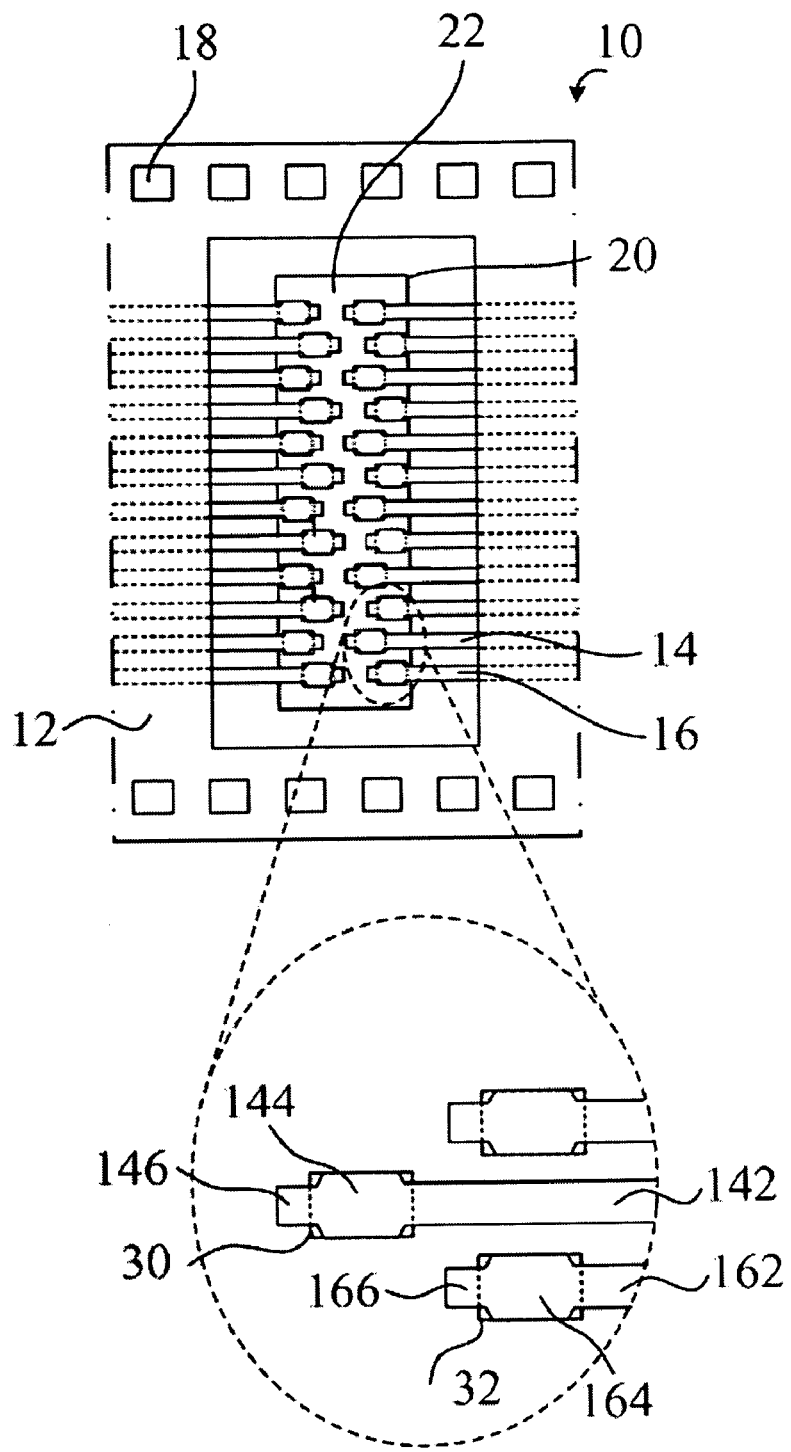
FIG. 1 is a schematic diagram of a flexible substrate 10 for the package of a die 20 according to the first preferred embodiment of the present invention.

Please refer to FIG. 1. FIG. 1 is a schematic diagram of a flexible substrate 10 for the package of a die 20 according to the first preferred embodiment of the present invention. In this embodiment, the flexible substrate 10 is used in a tape carrier package. As shown in FIG. 1, the flexible substrate 10 includes a flexible insulating film 12 and a plurality of first leads 14. The material of the flexible insulating film 12 can be polyimide (PI), polyester (PET), or other similar materials. Furthermore, there are a plurality of sprocket holes 18 formed on the two sides of the flexible insulating film 12 in equidistant for transportation and positioning. The die 20 has an active surface 22 and a plurality of first bond pads (not shown) which are arranged in the form of a row and are formed on the active surface 22 of the die 20.

The plurality of first leads 14 are formed on the flexible insulating film 12, and they provide electronic connection for the die 20. Each of the first leads 14, corresponding to one of the first bond pads, has a respective strip-shaped first body portion 142, a respective first bond portion 144, and a respective first extension portion 146. The width of the first bond portion 144 is larger than the width of the first body portion 142 and the width of the first extension portion 146. Additionally, the width of the first extension portion 146 of each of the first leads 14 is substantially equal to that of the first body portion 142. When the die 20 is packed, the first bond portion 144 of each of the first leads 14 is bonded to the corresponding first bond pad by a respective first bump 30

Thereby, when the die 20 is packed, the adhesive force of the first leads 14 is increased because the width of the first bond portion 144 of the first leads 14 is larger than or equal to the size of the first bumps 30 which will be bonded. The increased adhesive force of the first leads 14 can prevent the leads 14 from being peeled off from the first bumps 30, thus increasing the reliability of the package. Moreover, because the first connecting portion 144 is larger, the electronic conductivity of the first leads 14 in the present invention is greater than in the prior arts.

In this embodiment, the die 20 also has a plurality of second bond pads (not shown). The plurality of second bond pads are arranged in the form of a row and are formed on the active surface 22 of the die 20. Furthermore, the plurality of second bond pads are formed closer to the edge of the flexible substrate 10 than the plurality of first bond pads. The flexible substrate 10 further includes a plurality of second leads 16. Each of the plurality of second leads 16 corresponds to one of the plurality of second bond pads, and each has a respective strip-shaped second body portion 162, a respective second bond portion 164, and a respective second extension portion 166. The width of the second bond portion 164 is larger than that of the second body portion 162 and the second extension portion 166. Additionally, the width of the second extension portion 166 of each of the second leads 16 is substantially equal to that of the second body portion 162.

The plurality of second leads 16 are formed on the flexible insulating film 12 and are staggered alternately with the first leads 14. That is to say, the second bond portion 164 of each of the second leads 16 is disposed between the first body portions 142 of two of the first leads 14 adjacent to the one second lead 16. When the die 20 is packed, the second bond portion 164 of each of the second leads 16 is bonded to the corresponding second bond pad by a respective second bump 32.

The flexible substrate 10, in accordance with the present invention, can allow a multiple leads package due to the staggered arrangement of the first leads 14 and the second leads 16. Moreover, the increased width of the first bond portion 144 and the second bond portion 164 can resolve the problem of the leads being peeled off from the bumps caused by the weak adhesive force in the multiple leads packaging process of the prior arts, thus increasing the reliability of the package. Because the flexible substrate 10 has larger contact area to bond to the bumps, the electrical conductivity of the leads is greater than that of the prior arts.

Figure 2:
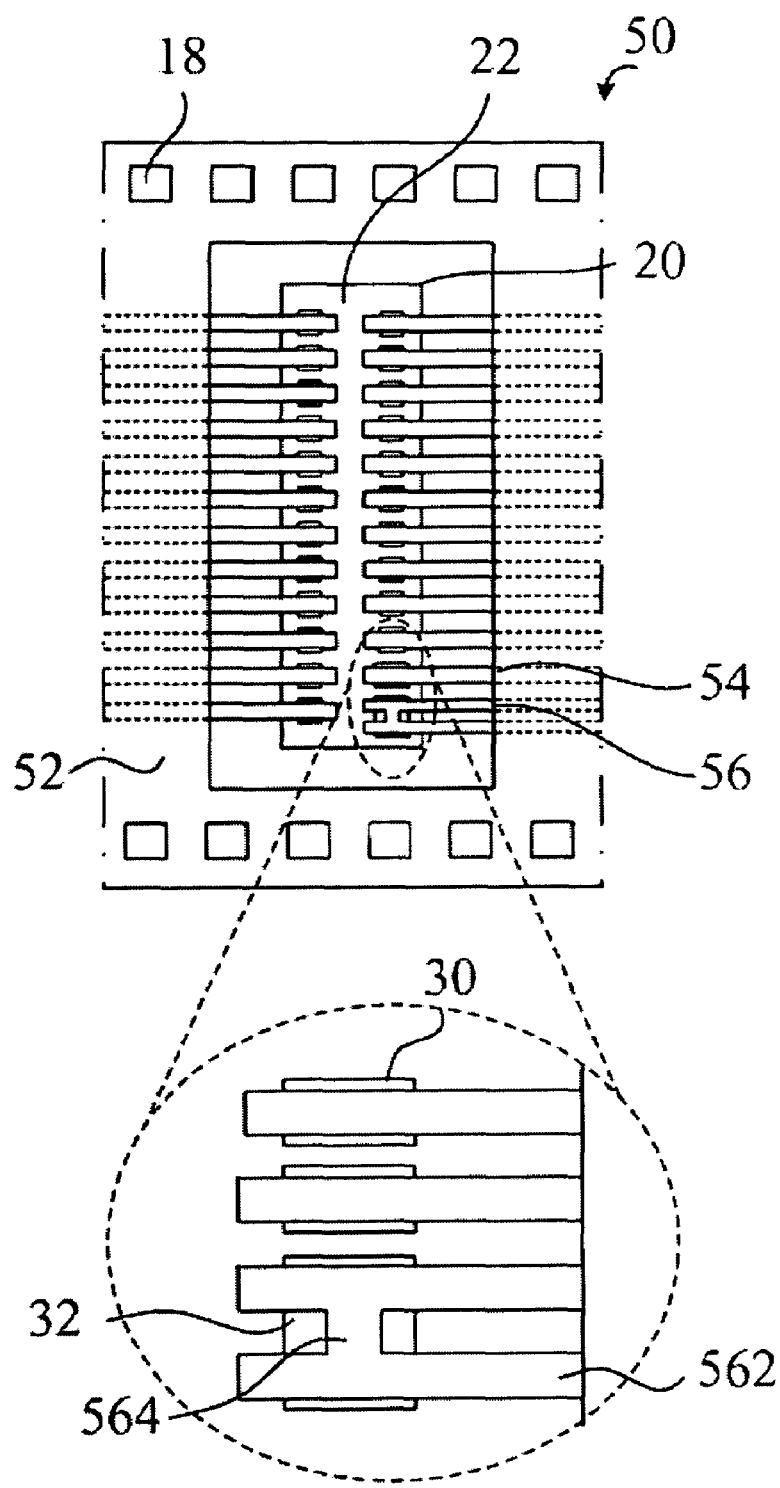
FIG. 2 is a schematic diagram of a flexible substrate 50 for the package of a die 20 according to the second preferred embodiment of the present invention.

Referring to FIG. 2, FIG. 2 is a schematic diagram of a flexible substrate 50 for the package of a die 20 according to the second preferred embodiment of the present invention. In this embodiment, the flexible substrate 50 is used in a tape carrier package. As shown in FIG. 2, the flexible substrate 50 includes a flexible insulating film 52, a plurality of strip-shaped first leads 54, and at least one bridge lead 56. In additional, the die 20 has an active surface 22, a plurality of first bond pads (not shown), and at least one second bond pad (not shown). The plurality of first bond pads are arranged in the form of a row and are formed on the active surface 22 of the die 20.

The plurality of first leads 54 is formed on the flexible insulating film 52, and each of the first leads 54 corresponds to one of the first bond pads. The at least one bridge lead 56 formed on the flexible insulating film 52 corresponds to one of the at least one second bond pad. Additionally, each of the at least one bridge lead 56 has two respective body portions 562 and at least one bridge portion 564. The width of each of the body portions 562 of each of the at least one bridge lead 56 is substantially equal to that of one of the first leads 54. Moreover, the at least one bridge portion 564 is connected between the two body portions 562. When the die 20 is packed, each of the first leads 54 is bonded to the corresponding first bond pad by a respective first bump 30, and each of the at least bridge lead 56 is bonded to the corresponding second bond pad by a respective second bump 32. The size of the second bump 32 is larger than that of the first bump 30.

Accordingly, when the die 20 is packed, the breaking of the lead caused by the effect of shear force and the resulting electricity disconnection can be avoided because of the shape of the bridge lead 56, thus increasing the reliability of the tape carrier package. Furthermore, the bridge lead 56 can be provided for the positioning of the inner lead bonding process because of its shape, so the flexible substrate 50 can be provided for alignment and positioning of the inner lead bonding process machine.

It should be noticed that the flexible substrate for the packaging of a die, in accordance with the present invention, can also be applied to a chip-on-film package process.

The leads of the flexible substrate for the package of a die of the present invention have enough adhesive force because of the increased contact area between the leads and the bumps, thus maintaining the bonding to the bumps and further increasing the electrical conductivity of the leads. For the bumps with larger area, the flexible substrate of the present invention has a bridge lead which can reduce the probability of peeling off the leads from the bump caused by shear force. Moreover, the bridge lead can be provided for the alignment and positioning of the inner lead bonding process machine because of its shape.

With the example and explanations above, the features and spirits of the present invention will be hopefully well described. Those skilled in the art will readily observe that numerous modifications and alterations of the device may be made while retaining the teaching of the present invention. Accordingly, the above disclosure should be construed as limited only by the metes and bounds of the appended claims.

What is claimed is:

1. A flexible substrate for a package of a die having an active surface and a plurality of first bond pads and at least one second bond pad, the first bond pads being arranged in a form of a row and formed on the active surface of the die, said flexible substrate comprising:

a flexible insulating film;
a plurality of first leads, formed on the flexible insulating film, each of the first leads corresponding to one of the first bond pads; and
at least one bridge lead, formed on the flexible insulating film, each of the at least one bridge lead corresponding to one of the at least one second bond pad and having respective two body portions and at least one bridge portion connecting the two body portions, wherein both of the body portions are formed on the flexible insulating film and elongated to the die;

wherein when the die is packed, each of the first leads is by a respective first bump bonded to the corresponding first bond pad, each of the at least one bridge lead is by a respective second bump bonded to the corresponding second bond pad, the size of the second bump is larger than that of the first bumps;

wherein the at least one bridge lead is bonded to the corresponding second bump with the bridge portion and part of each body portion adjacent to the bridge portion.

2. The flexible substrate of claim 1, wherein the first leads exhibit a strip shape.

3. The flexible substrate of claim 1, wherein the die is packed via said flexible substrate by a tape carrier package process.

4. The flexible substrate of claim 1, wherein the die is packed via said flexible substrate by a chip-on-film package process.

5. The flexible substrate of claim 1, wherein the width of each of the body portions of each of the at least one bridge lead is substantially equal to that of one of the first leads.

6. The flexible substrate of claim 1, wherein the flexible insulating film comprises polyimide (P1) or polyester (PET).

7. The flexible substrate of claim 1, further comprising a plurality of sprocket holes on opposite sides of the flexible insulating film.

8. The flexible substrate of claim 1, wherein the plurality of second bond pads are closer to an edge of the flexible substrate than the plurality of the first bond pads.

* * * * *